United States Patent [19]
Schuck et al.

[11] Patent Number: 5,960,636
[45] Date of Patent: Oct. 5, 1999

[54] METHOD AND APPARATUS FOR PRECOOLING A MASS PRIOR TO IMMERSION IN A CRYOGENIC LIQUID

[75] Inventors: Thomas W. Schuck, Easton; Stanley L. Morton, Macungie; David J. Chalk, Slatington, all of Pa.; Xianrui Huang, Florence, S.C.; Lawrence Vincent Bischke, Florence, S.C.; Shaun Patrick O'Shea, Florence, S.C.

[73] Assignee: Air Products and Chemicals, Inc., Allentown, Pa.

[21] Appl. No.: 08/970,376

[22] Filed: Nov. 14, 1997

[51] Int. Cl.[6] ...................................................... F25D 13/06
[52] U.S. Cl. .................................... 62/63; 62/332; 62/374
[58] Field of Search ................................. 62/63, 332, 374

[56] References Cited

U.S. PATENT DOCUMENTS 3,413,818 12/1968 Pelmulder ..................................... 62/63
3,485,055 12/1969 Webster et al. ............................... 62/63
4,856,285 8/1989 Acharya et al. ............................ 62/332
5,694,776 12/1997 Sahm ........................................ 62/332

*Primary Examiner*—Ronald Capossela
*Attorney, Agent, or Firm*—William F. Marsh

[57] ABSTRACT

An apparatus and method for precooling a mass to be cooled to a final low temperature by immersion in a cryogenic liquid, e.g. liquefied helium. The gaseous phase of the cryogenic liquid is cooled by heat exchange with a cryogenic liquid having a higher boiling point than the cryogenic liquid within which the mass is to be immersed. The cooled gaseous phase is circulated through a vessel containing the mass, recovered, recooled and recirculated until the mass and its containment vessel are at the desired precooling temperature. Thereafter cryogenic liquid can be introduced into the vessel to immerse the mass.

10 Claims, 1 Drawing Sheet

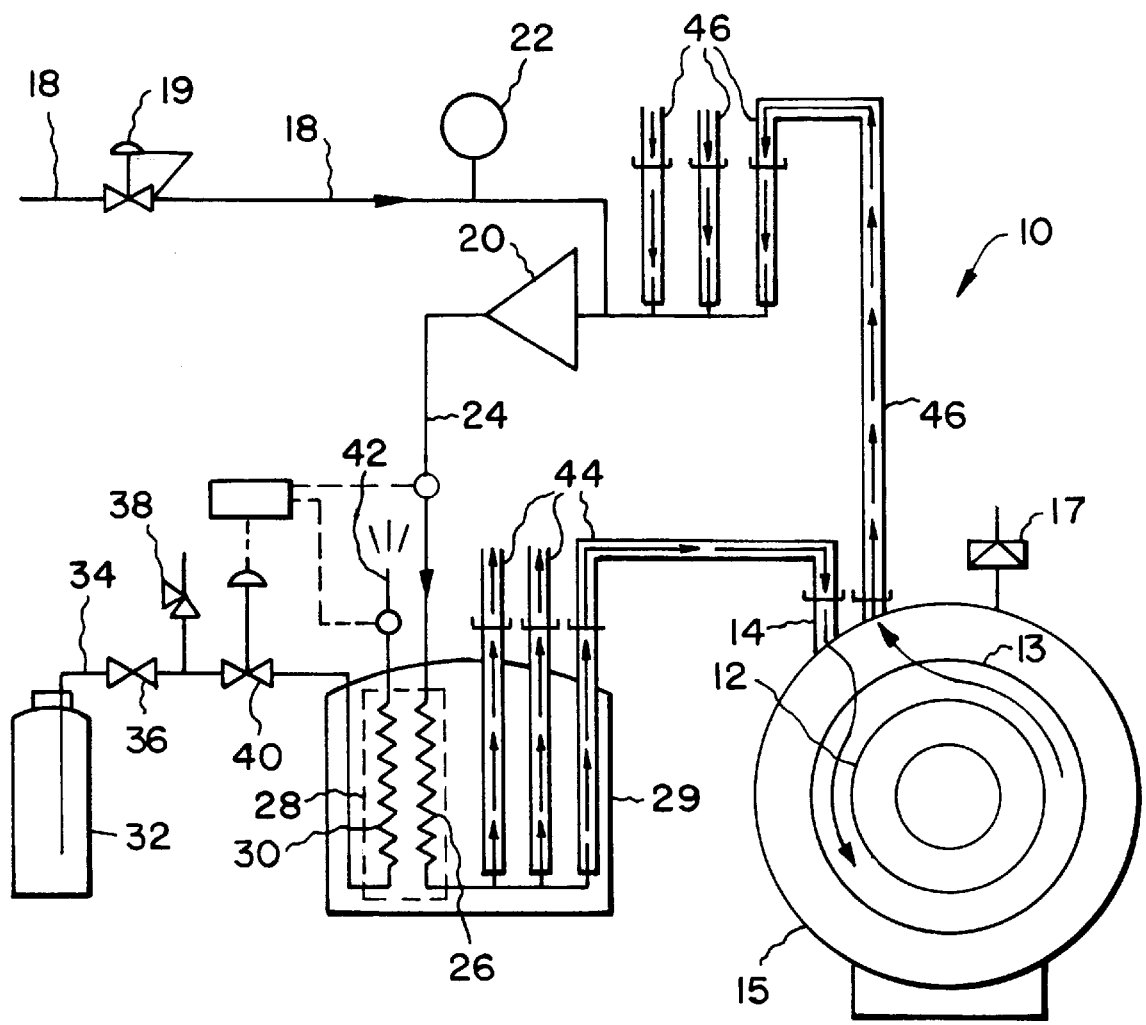

METHOD AND APPARATUS FOR PRECOOLING A MASS PRIOR TO IMMERSION IN A CRYOGENIC LIQUID

CROSS REFERENCE TO RELATED APPLICATION

Not applicable

STATEMENT REGARDING FEDERALLY SPONSORED RESEARCH OR DEVELOPMENT

Not applicable

BACKGROUND OF THE INVENTION

This invention relates to cooling a mass by immersion in a cryogenic liquid, e.g. helium cooled superconducting magnet assemblies suitable for magnetic resonance imaging (hereinafter called "MRI"), and more particularly to an improved and simplified means for the precooling of the mass in order to conserve cryogenic liquid coolant, and avoid introduction of contaminants into the mass being cooled.

As is well known, a superconducting magnet can be made superconducting by placing it in an extremely cold environment, such as by immersion in a liquid cryogen, e.g. liquid helium contained in a cryostat or pressure vessel. The extreme cold ensures that the magnet coils are maintained in superconducting operation, such that when a power source is initially connected to the magnet coils (for a period, for example, of one hour) to introduce a current flow through the coils, the current will continue to flow through the coils even after power is removed due to the absence of electrical resistance in the coils, thereby maintaining a strong magnetic field. Superconducting magnet assemblies find wide application in the field of MRI.

While the use of liquid helium to provide cryogenic temperatures is widely practiced and is satisfactory for MRI operation the provision of a steady supply of liquid helium to MRI installations all over the world has proved to be difficult and costly. As a result, considerable research and development efforts have been directed at minimizing the amount of boiling cryogen such as liquid helium, required to cool the mass initially, and to maintain it's low temperature during continued service.

One method of minimizing the use of and assisting, liquid helium cooling is to utilize an initial auxiliary cooling medium such as flowing liquid nitrogen through the magnet to obtain an initial cool temperature, such as 80–90 K., and then purging the nitrogen (to avoid nitrogen contamination which can cause superconducting magnet instability) before commencing the final cooling by liquid helium cooling to the superconducting temperature.

The purging of the liquid nitrogen is accomplished by flowing pure, warm helium gas through the magnet. This is followed by the introduction of the liquid helium into the magnet to further cool the magnet to the superconducting temperatures (such as 4° K.).

However, the initial introduction of cold liquid nitrogen into the magnet for precooling shocks the magnet, due to strains caused by uncontrolled rapid cooling, and can affect the purity of the helium. For example if the nitrogen is not completely purged from the cryostat or containment vessel prior to filling with liquid helium, helium purification equipment must be able to separate the nitrogen thus making the recovery process more difficult which in turn can decrease the amount of helium which can be recovered.

In addition, the sequential introduction of liquid nitrogen into a cryostat or containment vessel holding the superconducting magnet followed by purging prior to filling the vessel with liquid helium is time consuming. The helium gas purge also warms the magnet from liquid nitrogen temperature, around 80° K., to higher temperatures such as 110° K., requiring more liquid helium and time to cool the magnet to superconducting temperatures. Also, subsequent cooling of the magnet to superconducting temperature could result in nitrogen ice forming within the magnet which could destabilize superconducting operation of the magnet resulting in possible "quenching", a sudden discontinuance of superconducting operation with rapid helium gas boiloff and generation of high pressure within the magnet.

It is accordingly desirable to avoid contamination of the superconducting magnet by liquid nitrogen, to minimize the helium required to obtain superconducting operation, and to reduce the overall time required for the magnet to be cooled to superconducting temperatures.

BRIEF SUMMARY OF THE INVENTION

The present invention is a liquid nitrogen precooling system and method used in conjunction with a system to cool a mass by immersion in a liquefied cryogen, e.g. liquid helium cooling of a superconducting magnet. The invention pertains to cooling of the gaseous phase of the liquid cryogen by heat exchange with a second cryogenic liquid having a normal boiling point higher than that of the liquid cryogen used to cool the mass by immersion. For example if helium is used for cooling a superconducting magnet system, gaseous helium can be used to precool the magnet system by cooling the gaseous helium to the temperature of liquid nitrogen by heat exchange and circulating the cooled gaseous helium through the magnet assembly. Using cold gaseous helium to precool the magnet assembly will avoid contamination of the helium and mass, reduce thermal shock, eliminate contamination of recovered helium, and eliminate warming due to introduction of helium gas for nitrogen purging.

According to the present invention, precooling a mass by using the gaseous phase of the liquid immersion coolant can reduce the thermal strains in the mass by controlling the rate of cooling, and reduce the total time to cool the mass to the final operating temperature.

According to one aspect of the invention, a helium cooled superconducting magnet is provided with a system wherein liquid nitrogen is used to cool gaseous helium which is circulated into the vessel containing the magnet to cool the magnet to an initial low temperature prior to subsequent cooling of the magnet by immersion in the liquid helium to effect cooling to a superconducting temperature. Thus initial precooling of the magnet by using helium gas cooled to a specified temperature, e.g. by heat exchange with liquid nitrogen, prevents liquid nitrogen from entering the magnet during the initial cooldown of the superconducting magnet.

The magnet, free of nitrogen contamination after the initial cooling, is ready for immediate introduction of the liquid helium to further reduce the magnet temperature to enable superconducting operation.

The amount of helium required and the time involved in reaching the initial low temperature are minimized without contamination of the superconducting magnet or helium gas by the liquid nitrogen.

BRIEF DESCRIPTION OF THE SEVERAL VIEW OF THE DRAWINGS

FIG. 1 is a schematic diagram of a superconducting magnet employing a cooling system according to the present invention.

DETAILED DESCRIPTION OF THE INVENTION

The objective of the invention is to precool a mass (e.g., a superconducting magnet) from essentially ambient temperature (295° K.) to about 78° K. with gaseous helium. The gaseous helium must be at nearly liquid nitrogen temperature (or less) to accomplish this. After precooling, the magnet will be further cooled and filled with liquid helium.

The problem confronting industry has been that, with no device to cool and circulate gaseous helium, direct injection of liquid nitrogen has been the method of cooling such equipment. Nitrogen is a contaminant in these systems, and has been found to adversely affect operation of the magnet. Nitrogen is believed to cause spurious quenches (return of the coils to a resistive state rather than superconductive) with a large, rapid release of heat as the magnetic field collapses. To establish high helium purity inside the magnet, the magnet is purged with pure (warm) helium gas after the direct liquid nitrogen injection phase. Liquid nitrogen may remain in isolated pools within the magnet, so experience has shown that purging does not necessarily completely eliminate residual nitrogen from the magnet. The introduction of warm helium gas results in some rewarming of the magnet, which requires additional liquid helium to complete the final cooling stage. The process of precooling the magnet is somewhat labor intensive, and has historically taken about 3 days.

In one method of the present invention a stream of pure helium is cooled with a coiled tube heat exchanger in a liquid nitrogen bath. The cooled helium gas is not recirculated, so once it has been through the heat exchanger (cooling it) and the pre-purged magnet (cooling the magnet), it is released to a recovery system. The quantity of helium required to cool a 4000 pound magnet in this manner exceeds 1100 pounds (500 kg) which has a marketable value of at least $8000. This is a cost prohibitive method of precooling a magnet.

A preferred method and apparatus of the present invention recirculates gaseous helium from the mass to be cooled, cools the helium to nearly liquid nitrogen temperature (approx. 78° K.) in a heat exchanger, and uses the cold gaseous helium transfered via vacuum jacketed transfer lines to precool the mass. By this method the gaseous helium is continuously recooled and reused to precool the mass.

Referring to FIG. 1 a system 10, includes a mass 12 to be cooled. Mass 12, may for example, be a superconducting magnet of the type used in MRI equipment. If the mass 12 to be cooled is a superconducting magnet it would ordinarily be housed in a pressure vessel 13 which is an inner helium containing vessel surrounding the magnet 12. Inner vessel 13 is equipped with a pressure relief device 17 to protect the inner vessel 13 and precooling system from overpressure. The outer vessel 15 is adapted to maintain the exterior of the inner vessel under vacuum conditions to aid in insulating the inner vessel from ambient temperatures. Such devices are commonly cooled to liquid helium temperature to permit the magnet to achieve a superconducting state. The liquid helium can be introduced into the pressure vessel or cryostat through liquid helium supply conduit 14 as is well known to a worker skilled in the art.

Prior to filling the vessel 13 holding magnet 12 with liquid helium the magnet 12 and the inner vessel containing the mass or magnet 12 are preferably precooled to approximately liquid nitrogen temperature e.g. 78° K. (−195° C.). In order to precool magnet 12 and the inner vessel 13 prior to filling with liquid helium, helium gas is supplied through conduit 18 from a helium gas supply (not shown) via helium gas control valve 19 through a motor driven helium gas circulating blower 20 to a heat exchanger 28. Helium gas circulating blower 20 can be a commercial regenerative blower as manufactured by EG&G Rotron which was modified for service at liquid nitrogen temperature, e.g. approximately 80° K. (−193° C.). The modifications to the commercial blower included:

a. All parts made of materials not suited for low temperature service were modified to suitable material.

b. The bearing arbor design was modified to a longer thinner shaft with greater bearing span.

c. The cold end (nearest impeller) bearing design was altered to incorporate a backup sliding journal bearing, in the event the ball (rolling element) bearing failed.

d. The leakage path of helium from the shaft seal to the ambient was diverted to purge the cold end bearing and bearing arbor. This protects the cold bearing from exposure to humid ambient air which could corrode the bearing elements or freeze, preventing rotation. This further acts as a barrier to the ingress of air into the helium system, thus maintaining process purity.

e. The cold end bearing is heated with an electrical heater to prevent its grease from freezing, or, preferably, a bearing capable of operating at extremely low temperature is used.

The blower flow rate and developed pressure depend on the density of the product (re-used gaseous phase) compressed. Both the flow rate and the developed pressure increase as the product density increases. The product density increases as the temperature of the mass to be cooled decreases so that recirculation of the gaseous phase increases as the mass cools. This effectively controls the flow by limiting it at the beginning of the cooling process when the mass is sensitive to thermal strains and increasing it as the cooling process nears completion.

In order to precool the magnet 12 and the inner vessel, gaseous helium is circulated through the vessel 13 with the gaseous helium being precooled to approximately the temperature of liquid nitrogen, e.g. 78° K. (−195° C.). As shown in FIG. 1, gaseous helium supplied via conduit 18 is pressurized in blower 20 to maintain the pressure in the system at a level of from 0.5 to 0.7 psig. Pressurized helium exiting blower 20 is introduced into a conduit 24 and then into a heat exchange conduit 26 disposed in a heat exchanger 28. Heat exchanger 28 can be a commercial unit such as a plate-fin type heat exchanger manufactured and sold by ITT Corporation. The gaseous helium in heat exchange conduit 26 is cooled by a counter current flow of liquid nitrogen introduced into heat exchange conduit 30 in heat exchanger 28. Liquid nitrogen is introduced into the heat exchange conduit 30 from a liquid nitrogen supply vessel 32 through conduit 34, control valve 36, pressure relief valve 38, and temperature control valve 40. Temperature control valve 40 is responsive to the difference in temperature between the discharge line 42 for liquid nitrogen exiting the heat exchanger 28 and the helium inlet 24. The heat exchange conduits 26, 30 are housed in a thermally insulated enclosure 29 which makes up the outer housing of heat exchanger 28 to isolate the conduits 26, 30 from ambient heat infiltration. The liquid nitrogen entering heat exchange conduit 30 may contain a significant amount of vapor. Flow of liquid nitrogen in conduit 30 is controlled primarily by the manual throttling of valve 36 and governed by a differential temperature control valve 40 which maintains the exhaust flow in conduit 42 of gaseous nitrogen at a temperature 5 to 10°

K. cooler than gaseous helium entering the heat exchanger conduit 26 from blower 20 via conduit 24. A small part of the gaseous nitrogen stream leaving the heat exchanger may be diverted into the enclosure 29 to maintain a dry environment within it. Gaseous helium leaving the heat exchanger 28 through vacuum jacketed lines 44 is at a temperature of about 80° K. which is slightly higher than the temperature of the liquid nitrogen entering heat exchanger 28. Vacuum jacketed lines 44 can be used to direct cooled gaseous helium to a plurality of cryostats one of which is shown as the vessel 13. The compressed cooled gaseous helium transferred via the vacuum insulated transfer lines 44 minimizes heat transfer to the helium gas from ambient. Within the mass 12 to be cooled it is preferred to maximize separation of the colder incoming helium from the warmer helium exiting through vacuum jacketed line 46, in order to maximize the heat transfer from the mass to be cooled to the incoming gaseous helium stream before it exits the vessel 13. Helium exiting the vessel 13 via conduit 46 and helium exiting other vessels through the additional conduits 46 is conducted to the circulating blower 20 in order to maintain the circulation of the helium through the heat exchanger 28 where the helium is once again cooled and reintroduced into the vessel 13 to precool the mass 12. Additional make-up gaseous helium can be introduced at any time via line 18 and control valve 19.

Table 1 sets forth the process parameters for precooling a vacuum jacketed mass according to the present invention.

TABLE 1

| Fluid | Pressure | Temperature | Flowrate | Composition |
| --- | --- | --- | --- | --- |
| 1. Helium | 0–15 psig | 300° K–80° K | 50–100 scfm | Pure Helium |
| 2. Helium | >0–18.5 psig | 350° K–90° K | 50–100 scfm | Pure Helium |
| 3. Helium | >0–18.5 psig | 78° K–85° K | 50–100 scfm | Pure Helium |
| 4. Nitrogen | <1.0 psig | Sat. Liq. 78° K | 37–4.5 scfm | Pure N2 |
| 5. Helium | >0–18.5 psig | 78° K–86° K | 50–100 scfm | Pure Helium |

Table 1 sets forth the following locations for the data: 1 is the gas withdrawn from the inner vessel; 2 is at the blower discharge; 3 is at the cold end of exchanger path 26; 4 is at the inlet for liquid nitrogen to exchanger path 30; and, 5 is the entry of liquid helium to inner vessel 13.

Other process conditions can be developed if more than one mass is to be cooled at the same time. Since additional masses may not be at the same temperature at the same times, the vapor exiting the container of the mass to be cooled will generally be at a temperature between the limits stated above. Mass flow rates will be slightly less than exact multiples of the flow rates listed for single mass cooling due to the reduction in differential pressure developed by the blower at higher capacities.

There are no prior art processes in which circulation of gaseous helium coolant in a closed loop is maintained by a cryogenic circulating compressor. This may be due to difficulty in designing such compressors, or the high cost of purchasing such compressors suited for cryogenic service. The once through process of cooling a helium stream to liquid nitrogen temperature is prohibitively expensive as set out above.

The present invention is also of value because it eliminates contaminants from the cooling process thus eliminating the use of purge gas which would otherwise be about 7% of the helium used to purge, cool and fill a device such as an MRI magnet. Furthermore the process and apparatus of the present invention prevents rewarming of a precooled mass which occurs when warm helium is used to displace and purge liquid nitrogen used as a direct coolant. This reduces the additional amount of liquid helium required to complete the cooling and filling process by about 16%. In locations where the price of liquid helium is high this can amount to significant savings associated with preparing and operating devices such as MRI magnets.

Furthermore, as stated above eliminating contaminants from the cooling medium, e.g. helium, is important to prevent devices such as MRI magnets from "quenching" as described above.

Since the liquid nitrogen is kept separated from helium gas flow in the heat exchanger, there is no nitrogen contamination of the pressure vessel so that a purge of the pressure vessel after the initial cooling is not required, and control of the cooling rate by control of nitrogen flow with flow control valve(s) minimizes the cooling time and nitrogen consumption.

The method of the present invention revolves around using a gas, e.g. helium which is identical in composition to the cryogenic liquid within which the mass, e.g. MRI magnet, is to be immersed for cooling. The gas can be provided from a separate source or can be boil-off taken from a storage vessel containing the cryogenic liquid.

According to the method of the present invention the gas, identical in composition to the cryogenic liquid, is precooled by heat exchange with a cryogenic liquid having a normal boiling point to which the gas is to be precooled. The normal boiling point of this second or heat exchange cryogenic fluid should be at or below that of the temperature to which the gas is to be cooled but may be higher than that of the cryogenic liquid used to immerse the mass to be cooled. The gas, after heat exchange with the second cryogenic liquid, is introduced into the vessel containing the mass to be precooled. Warmed gas is withdrawn from the vessel after contact with the mass to be precooled and is recirculated through a recirculating blower to the heat exchanger for cooling by heat exchange with an additional supply of the secondary cryogenic fluid. The recirculating blower maintains the differential pressure of the recirculating gas and precooled gas to circulate the gas through the lines, exchanger and mass. Additional gas can be introduced into the recirculating blower upstream of the blower in order to maintain the volume and pressure of recirculating gas in the system. The second cryogenic fluid can be recovered for reuse or disposed of in any convenient manner, depending upon the economics of operating the overall system.

For example, if the mass to be cooled is an MRI magnet that is disposed in an insulated vessel and is normally cooled by immersing in liquid helium the secondary cryogenic fluid can be liquid nitrogen.

Once the mass is precooled to the desired temperature then the cryogenic liquid can be introduced into the vessel containing the mass and the mass can be submerged in the cryogenic fluid to begin normal operations.

Although illustrated and described herein with reference to certain specific embodiments, the present invention is nevertheless not intended to be limited to the details shown. Further, various modifications may be made in the details within the scope of the invention as defined in the following claims.

What is claimed is:

1. A method for precooling a mass to be immersed in a cryogenic liquid to a temperature below ambient temperature comprising the steps of:

providing a source of the gaseous phase of the cryogenic liquid used to immerse the mass;

cooling the gaseous phase by heat exchange with a second cryogenic liquid having a normal boiling point at approximately the desired precooling temperature; and using the cooled gaseous phase to contact and precool the mass to approximately the temperature of the gaseous phase.

2. A process according to claim 1 wherein the gaseous phase after contacting said mass is continuously re-cooled and re-used to precool the mass.

3. A process according to claim 2 including adding additional gaseous phase into the re-used gaseous phase to maintain precooling parameters of the gaseous phase.

4. A process according to claim 1 including the steps of immersing the mass in the liquid cryogen after being precooled to the desired temperature.

5. A process according to claim 2 including limiting the initial rate of cooling of the mass by reducing the circulation rate of the re-used gaseous phase.

6. An apparatus for precooling a mass to be cooled to a final low temperature by immersion in a cryogenic liquid comprising in combination:

a vessel to contain a bath of said cryogenic liquid and said mass immersed therein;

a source of gas having a composition identical to that of the cryogenic liquid;

heat exchange means adapted to precool said gas by heat exchange with a second cryogenic liquid having a normal boiling point at or slightly below the normal boiling point of the temperature to which the mass is to be precooled;

means to introduce said precooled gas into said vessel to precool said vessel and said mass;

means to withdraw said precooled gas from said vessel after cooling said vessel and said mass; and means for re-circulating to said vessel said withdraw gas and re-cooling said withdraw gas in said heat exchanger prior to being reintroduced into said vessel.

7. An apparatus according to claim 6 including a circulating blower to recirculate and maintain said precooled and recirculating precooled gas.

8. An apparatus according to claim 5 including means to introduce said cryogenic liquid into said vessel.

9. An apparatus according to claim 7 wherein said circulating blower is a regenerative blower modified to operate at low temperature by maintaining its bearings at suitable operating temperatures, and purging said bearings with the gaseous phase of the cryogenic liquid.

10. An apparatus according to claim 6 wherein said means to withdraw and recirculate said gas includes vacuum jacketed transfer line between said vessel and said heat exchanger.

* * * * *